United States Patent [19]
Scott

[11] Patent Number: 4,749,449
[45] Date of Patent: Jun. 7, 1988

[54] METALLIZATION UTILIZING A CATALYST WHICH IS REMOVED OR DEACTIVATED FROM UNDESIRED SURFACE AREAS

[75] Inventor: Kevin D. Scott, Wilmington, Del.

[73] Assignee: E. I. Du Pont de Nemours and Company, Wilmington, Del.

[21] Appl. No.: 58,867

[22] Filed: Jun. 5, 1987

[51] Int. Cl.<sup>4</sup> .............................................. C25D 5/02
[52] U.S. Cl. ...................................................... 204/15
[58] Field of Search ...................... 204/15, 20, 30, 38.4

[56] References Cited

U.S. PATENT DOCUMENTS

| 3,099,608 | 7/1963 | Radovsky | 204/15 |
| 4,683,036 | 7/1987 | Morrissey | 204/15 |

FOREIGN PATENT DOCUMENTS

| 3304004 | 8/1984 | Fed. Rep. of Germany | 204/15 |
| 2123036 | 7/1986 | United Kingdom | 204/15 |

*Primary Examiner*—T. M. Tufariello

[57] ABSTRACT

Metallization of nonconductive through holes with pattern plating of a conductive surface is undertaken by removing or deactivating a catalyst from undesired areas prior to electroplating onto the catalyzed surface.

7 Claims, No Drawings

METALLIZATION UTILIZING A CATALYST WHICH IS REMOVED OR DEACTIVATED FROM UNDESIRED SURFACE AREAS

BACKGROUND OF THE DISCLOSURE

The present invention is directed to a method of electroplating walls of nonmetallic dielectric holes in a substrate while selectively plating a pattern on the surface which lies outside of the holes. The present invention allows simultaneous pattern plating of a conductive surface layer whereby only portions of the conductive layer are plated while at the same time plating holes extending through the conductive layer and an insulating layer.

It is known in the prior art to electroplate a dielectric base employing a catalyst. Radowsky et al. U.S. Pat. No. 3,099,608 discloses a method of obtaining a conductive coating on through holes in printed circuit boards by depositing a thin nonconductive film of palladium metal and electroplating directly over the nonconductive palladium film. British Pat. No. 2,123,036 discloses a method for metallizing nonmetallic surfaces by electroplating in a vessel provided with a counter electrode and provided with an electroplating bath solution containing a metal (B) to be electroplated with the nonmetallic surfaces being provided with metallic sites of another metal (A) to obtain preferential deposition of metal (B) on metal (A).

German Preliminary Published Application No. DE 3304 004 discloses a process for the production of through hole plated circuits in perforations of a printed circuit board by first activating the surfaces of the perforations by means of a catalyst and then metallizing by galvanic metal deposition.

In spite of the disclosures of the above publication a need is present for a process which allows direct electroplating of nonconductive through holes extending through an insulating layer and portions of at least one conductive layer.

SUMMARY OF THE INVENTION

The present invention is directed to a process of electroplating an adherent electrically conductive coating onto a catalyzed nonconductive surface wherein the improvement comprises plating the conductive coating on at least one catalyzed through hole wall in a conductive layer and an insulating layer to form an electrically conductive pathway through the hole and plating the conductive coating in a pattern on a surface of the conductive layer comprising the steps of:

(a) forming at least one through hole through two layers of an article comprising a conductive layer and an insulating layer;

(b) forming a resist image on the surface of the conductive layer;

(c) applying all essential components of a catalyst system to the resist, exposed surface of the conductive layer and through hole wall;

(d) applying a removing or deactivating substance to the surface of the resist which does not substantially penetrate into the through hole and which removes or deactivates catalyst on the surface of the resist without substantially affecting the catalyst present on the surface of the through hole;

(e) electroplating the through hole wall with an adherent conductive layer to form an electrically conductive pathway and pattern plating onto the exposed conductive layer without plating an adherent conductive layer on the resist.

In a preferred embodiment the insulating layer separates at least two conductive layers which are preferably copper.

DETAILED DESCRIPTION OF THE INVENTION

The present invention is directed to a method which allows electroplating walls of through holes in a substrate comprising at least two layers, a layer of a conductive material such as copper and a layer of insulating material. In such articles a second conductive layer is present with the insulating layer separating the two conductive layers which are conventionally present as a thin film or foil. The present invention is particularly suited to the manufacture of printed circuit boards. These circuit boards initially utilize a starting substrate of an insulating layer clad on both sides with a thin conductive layer in a planar configuration. For electrical contact between the two conductive layers, through holes which may number into the hundreds or thousands of channels are formed by a drilling operation. Since the walls of the through holes without any further operation are not conductive, it is necessary to undertake metallization to provide an electrical pathway between the two conductive layers. Conventional techniques in the prior art involve electroless plating which causes a thin electrically conductive coating to be deposited on the surface of the through holes prior to an electroplating operation to deposit a thicker coating of the metal. Electroless deposition followed by electroplating is the conventional technique in commercial production of printed circuit boards. However such production requires a number of separate labor intensive operations and is relatively expensive and time consuming.

In the present invention electroplating is undertaken onto all essential components of a catalyst system which covers portions of a conductive surface and walls of through holes. Prior to application of the catalyst system it is necessary to form a resist image on the surface of the conductive layer. A resist (or precursor thereto) is initially applied to the surface of the conductive layer without substantially penetrating into the through holes. In the context of the present patent application resist is employed in its normal content and is inclusive of a polymeric material which is adherent and shields the surface of a substrate. Conventionally the resist has the ability to withstand an etching operation such as etching of copper with acid. Also the resist has the ability to be readily removed in an operation conventionally known as stripping.

The resist may be directly applied to the conductive surface as a liquid such as by a silk screening technique whereby the resist covers portions of the conductive surface layer except where electroplating is to occur, i.e., the resist shields the conductive surface in areas which are not to be plated. Also the resist does not cover the through holes. In such case the resist forms a resist image directly upon application to a substrate. Alternatively the resist image may be formed by application of a photosensitive material to cover an entire surface of the conductor including the through holes. Imagewise exposure to actinic radiation followed by development, i.e., washout, of unexposed resist allows removal of the resist from the openings of the through holes and portions of the conductive surface to which the catalyst system is to be applied. The photosensitive material may be solvent developable or aqueous developable, i.e., developable in an organic solvent for the resist or developable in an aqueous solution containing base such as a solution containing by weight 2% sodium carbonate. Examples of various resists and their methods of use are taught in Printed Circuits Handbook Edited by Clyde F. Combs, Jr. (Second Edition 1979) McGraw Hill Book Company in Chapters 6, 7 and 8 as well as in "Photoresist Materials & Processes" by William S. DeForest, 1975, McGraw Hill Book Company.

In a preferred embodiment of the present invention a resist in the form of a dry film is applied to the entire surface of the conductor such that it bridges or tents any through holes. Thereafter the film is exposed to actinic radiation to form a resist image and unexposed dry film is removed in accordance with well known techniques in the art. Both solvent developable and aqueous developable resists can be employed, i.e., unexposed material can be removed with an organic solvent or an aqueous solution containing, e.g., 2% by weight sodium carbonate.

With the resist image in place on the portions of the conductor surface without covering openings for through holes, all components of a catalyst system are applied to the entire surface including the resist, the unshielded conductive surface, and the through holes. In the present disclosure all components of a catalyst system refer to the materials necessary for the catalyst to be applied to the surface of the substrate to obtain an adherent electroplated conductive coating. Illustratively it may be necessary to employ several separate steps involving several different liquid treatments to obtain a catalyst which is in proper form for electroplating. A preconditioning of the substrate may be necessary to obtain proper catalyst adherence. In such event all components of a catalyst system involve both a preconditioning material applied in a first operation and the catalyst itself applied in a second operation.

Suitable catalyst systems which are inclusive of preconditioning and/or cleaning components are disclosed in U.S. Ser. No. 872,093 filed June 6, 1986 and British Pat. No. 2,123,036 both incorporated by reference herein. Pertinent sections on these documents are reproduced in a later section in the present patent application.

After application a removing or deactivating substance is applied to the surface of the resist with care taken that it does not penetrate into the through holes. It has been found that a wiping of a liquid across the surface of the resist allows removal or deactivation of the catalyst without substantial penetration of the liquid in the through holes. The liquid allows removal of the catalyst on the surface of the resist since a raised relief is present on the surface due to the resist. The wiping action removes catalyst from the raised relief formed by the resist without affecting through holes and conductive exposed areas of the surface which are not covered by resist. However it is within the scope of the invention that catalyst (or at least portions thereof) is removed from conductive areas since such catalyst is not essential for electroplating in contrast to the necessity for the catalyst (and catalyst system) in the walls of the nonconductive through holes. The liquid should be compatible with the resist, i.e., the deactivating or removal process should not destroy the integrity of the resist. Examples of suitable liquids which have been employed to remove catalyst are aqueous solutions of sodium hydroxide and sodium carbonate, 1,1,1-trichloroethane and acetone. One liquid may be suitable with a particular resist but for another resist may be unsuitable. In an alternate procedure the catalyst need not be removed from the surface of the resist. Deactivation can be undertaken e.g. by employment of a substance in the resist system which is photosensitive. Exposure to actinic radiation, preferably imagewise, only onto the resist, can serve to poison the catalyst such as by a chemical reaction. In such event the catalyst system no longer serves in its intended function. After removal or deactivation of the catalyst from the surface of the conductor, electroplating is undertaken, such as following: the procedure disclosed in U.S. Ser. No. 872,093 and British Pat. No. 2,123,036. After electroplating the resist is conventionally removed in a known manner.

GENERAL PROCEDURE FOR CATALYZATION AND ELECTROPLATING

As previously described several disclosures are known to directly electroplate a nonconductive surface by use of a catalyst.

One such procedure is disclosed in U.S. Ser. No. 872,093 filed June 6, 1986 which describes the use of the process is considered to use the reductive capacity of hydrogen for electrometallization of a nonconductive substrate. A metal catalyst is placed on a surface, the metal catalyst having the ability to combine with hydrogen. Hydrogen is then generated electrolytically from a protic bath in which the substrate and metal catalyst is immersed and combines with the metal catalyst. The combination of hydrogen with the metal catalyst includes inter alia the formation of a hydride with the metal catalyst and/or the formation of a solid solution of hydrogen in the metal latice of the metal catalyst and/or adsorption of hydrogen on the metal catalyst. A metal, referred to hereafter as the coated metal is then deposited on the surface previously coated with the metal catalyst combined with hydrogen. The coated metal is deposited from a metal salt and preferably is present in the protic bath from which hydrogen is generated electrolytically.

The process of combining the hydrogen with the metal catalyst is enhanced by contacting the metal catalyst with various promoters such as water soluble polymers, organic hydroxy compounds, surfactants, thiourea compounds, amino acids, polycarboxylic acids and various combinations thereof. The metal catalyst is combined with the promoter by applying the promoter to the non-conductive substrate prior to, simultaneously with or subsequent to the application of the metal catalyst to the nonmetallic substrate. A promoter may also be applied by any combination of steps, i.e., prior to, simultaneously with, and subsequent to the application of the metal catalyst to the non-conductive substrate.

The catalyst is preferably employed as an aqueous system and optionally contains a stabilizer that minimizes the catalyst's sensitivity to water. The stabilizer comprises a metal salt such as aluminum chloride, aluminum chlorohydrate and various equivalents thereof.

In one embodiment, the surface to be made conductive is coated in three steps, the first step comprising application of a cleaner/conditioner, the second step comprising application of a metal catalyst composition to the cleaned and conditioned surface and electrolytically coating the catalyst surface with a metal plating composition. The cleaner/conditioner comprises:
(a) a chelating agent (promoter);
(b) a fluoride salt;
(c) a thiourea compound (promoter);
(d) a surfactant (promoter) selected from a member of the group consisting of nonionic, cationic, anionic, and amphoteric surface active agents:
(e) an acid;
to obtain a cleaned and conditioned surface.

A catalyst is then applied to said cleaned and conditioned substrate of board comprising:
(a) a metal catalyst which can combine with hydrogen;
(b) an acid;
(c) a salt of $Sn^{+2}$;
(d) a member selected from the group consisting of an alkali metal stannate and a salt of $Sn^{+4}$;
(e) a stabilizer such as a metal salt that can be hydrolyzed to yield a metal hydroxide precipitate having a pK lower than $SnOHAn_1$
where $An_1$ is a monovalent anion;
to obtain a catalyzed substrate such as a circuit board.

The catalyzed surface is then electrolytically coated with a metal plating composition or bath comprising:
(a) a metal salt;
(b) an acid;
(c) an adjuvant (promoter) selected from a member of the group consisting of
  (i) polyhydroxy cyclic compounds especially those in which at least two hydroxyl groups are separated by one carbon atoms;
  (ii) acetylenic alcohols and their derivatives
  (iii) acetylenic compounds and
(d) a halogen ion.

The components of said cleaner/conditioner composition may be present in the following amounts on a molar basis:

| | |
|---|---|
| (1-a) | (a) from about 2 to about 500 parts of a chelating agent: |
| | (b) from 0 to about 200 and especially about 0.3 to about 200 parts of a fluoride salt; |
| | (c) from about 1.5 to about 90 parts of a thiourea compound; |
| | (d) from 0 to about 0.8 and especially about 0.03 to about 0.8 parts of said surfactant; |
| | (e) from 0 to about 0.3 part of a poly(oxyalkylene) condensate of an alkyl phenol; |
| | (f) from about 10 to about 180 parts of an acid. | where at least one of (d) or (e) is present.

In one aspect of the invention a cleaner/composition is provided comprising:

| | | |
|---|---|---|
| (1-b) | tartaric acid | 5–1000 g/l |
| | citric acid | 5–1000 g/l |
| | ammonium bifluoride | 0.2–120 g/l |
| | thiourea | 1.2–90 g/l |
| | conditioner: | |
| | 1-propanaminium N—(2-hydroxyethyl)-N,N—dimethyl-3-[(1-oxooctadecyl) amino]-phosphate (Catanac SP Trademark 67.5% by weight in isopropyl alcohol) | 0.1–2 ml/l |
| | Triton X-100 (trademark) wetting agent | 0.1–2 ml/l |

-continued

| | |
|---|---|
| $H_2SO_4$ (98%) | 5.0–300 ml/l |

The cleaner/conditioner may be prepared comprising the following:

| | | |
|---|---|---|
| (1-c) | tartaric acid | 20 g/l |
| | citric acid | 40 g/l |
| | ammonium bifluoride | 2 g/l |
| | thiourea | 15 g/l |
| | conditioner: | |
| | 1-propanaminium N—(2-hydroxethyl)-N, N—dimethyl-3-[(1-oxooctadecyl)amino]-phosphate (67.5% by wt. in isopropyl alcohol) | 0.5 ml/l |
| | Triton X-100 | 1.25 ml/l |
| | $H_2SO_4$ (98%) | 100 ml/l |
| | water | balance |

In the foregoing formulations the Catanac SP and the Triton X-100 (a nonionic polyoxyethylene octyl phenol condensate surfactant) comprises the surfactants and the citric acid and tartaric acid comprise the chelating agent.

The various equivalents as set forth herein for the foregoing components of the cleaner/conditioner and as known in the art may be substituted for such components on an equimolar basis.

The chelating agent (promoter) of the cleaner/conditioner composition may comprise any of the various classes of chelating agents and specific compounds disclosed in Kirk-Othmer, *Encyclopedia of Chemical Technology*, Third Edition, Volume 5, pages 339–368, incorporated herein by reference. Chelating agents that are preferred comprise the aminocarboxylic acids and the hydroxycarboxylic acids. Some specific aminocarboxylic acids that may be employed in this respect comprise ethylene-diaminetetraacetic acid, hydroxyethylene-diaminetriacetic acid, nitrilotriacetic acid, N-dihydroxy-ethylglycine, and ethylene-bis(hydroxy-phenylglycine). Tetra (lower alkyl) ammonium hydroxy compounds may also be employed where the lower alkyl has from about 2 to about 6 carbon atoms such as tetrabutyl ammonium hydroxide. Hydroxycarboxylic acids that may be employed comprise tartaric acid, citric acid, gluconic acid and 5-sulfosalicylic acid. Citric acid and its equivalents are especially preferred chelating agents. The amino carboxylic acids used as chelating agents include lysine, alanine, valine, leucine, isoleucine, proline, phenylalanine, tryptophan, methionine, glycine, serine, threonine, cysteine, tyrosine, asparagine, glutamine, aspartic acid, glutamic acid, arginine, histidine and the like such as the so called rare amino acids, e.g., gamma-amino butyric acid, gamma-methyleneglutamic acid, 5-hydroxylysine and the like. Mixtures of chelating agents may also be used, e.g., two or three or four component mixtures.

Any fluoride salt may be employed in the cleaner/conditioner in lieu of the ammonium bifluoride such as aluminum trifluoride, sodium fluoride, sodium bifluoride, potassium bifluoride, ammonium fluoride, fluorboric acid, and the like provided that the fluoride is liquid or solid at substantially room temperatures, e.g., from about 10° C. to about 20° C. The alkali metal fluorides such as those based on the Group IA or IIA metals of the Periodic Table of Elements and ammonium may be used in this respect.

The thiourea compound may be represented by the formula:

(C)(X)(N)₂(R¹)ₐ(R²)ₐ(R³)ₐ(R⁴)ₐ

R¹=
(1) H
(2) alkyl or alkenyl having up to about 6 carbons atoms
(3) aryl, aralkyl, or alkaryl having up to about 12 carbon atoms
(4) cycloalkyl, cycloalkylalkyl, or alkylcycloalkyl having up to about 12 carbon atoms
(5) R⁵(CO) where R⁵ may be the same as radicals (2) through (4) as defined above for R¹
(6) CH₂OH
(7) (C)(X)(N)₂ (R¹)ₐ(R²)ₐ(CO)₂
(8) (C)(X)(N)₂ R¹R²R³
(9) (C)(X)(N) R¹R²
(10) (C)(X)(N)₂R¹R²(CO).

R², R³ and R⁴ may be the same as radicals (1) through (6) as defined above for R¹.

a=1 or 0.

For the thiourea compounds including their analogs employed X=S, Se or Te; X preferably is S.

Mineral and organic acid salts of the thiourea compounds may also be used.

The thiourea compound comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); thioammelide (trimer of thiourea); monoalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or disubstituted thioureas such as naphthyl thiourea, diphenyl thiourea, cyclohexyl thiourea and the like, where the cyclic hydrocarbons has up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g., monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and R⁵OH, (R⁵ as defined above) especially where R⁵ is lower alkyl; thioureadioxide (aka formamidinesulfinic acid [1758-73-2, C.A. Reg. No.]); the reaction product of a saturated or unsaturated aliphatic or cyclic organic acid having up to about 12 carbon atoms and especially the lower aliphatic monocarboxylic acid reaction products with thiourea, e.g., acylthioureas, and the mineral acid salts of thiourea, e.g., thiourea mono- or di-sulfate.

Other thiourea compounds that may be employed comprise:
thiourea nitrate;
thiourea oxalate;
thiourea phosphate;
thiourea sulfate;
1-acetylthiourea;
1-acetyl-3-methylthiourea;
1-acetyl-2-thiourea;
S-acetyl-2-thiourea hydrochloride;
1-allylthiourea;
1-allyl-3-phenylthiourea;
1-allyl-2-thiourea;
1-(4-aminobenzenesulfonyl)thiourea;
1-(4-aminobenzenesulfonyl)-2-thiourea;
1-benzoyl-2-thiourea;
1-benzyl-2-thiourea;
1,3-bis(2-ethoxyphenyl)thiourea;
1,3-bis(hydroxymethyl)thiourea;
1,3-bis(1-hydroxy-2,2,2-trichloroethyl)thiourea;
1(2-bromo-2-ethylbutanoyl)thiourea;
1(2-bromophenyl)thiourea;
1-butylthiourea;
1-butyl-3-phenyl-2-thiourea;
1(2-chlorophenyl)thiourea;
3(4-chlorophenyl)-1,1-dimethylthiourea;
1(2-chlorophenyl)-2-thiourea;
1(4-chlorophenyl)-2-thiourea;
1,3-diacetylthiourea;
1,3-diethyl-1,3-diphenylthiourea;
1,3-diethyl-1,3-diphenyl-2-thiourea;
1,3-diethyl-2-thiourea;
1,1-dimethylthiourea;
1,3-dimethyl-2-thiourea;
1,1-di(2-naphthyl)thiourea;
1,3-di(1-naphthyl)-2-thiourea;
1,3-di(2-naphthyl)-2-thiourea;
1,3-diphenylthiourea;
1,3-diphenyl-1-methylthiourea;
1,3-diphenyl-S-methyl-2-thiourea;
1,1-diphenyl-2-thiourea;
1,3-diphenyl-2-thiourea;
1,1-dipropyl-2-thiourea;
1,3-dipropyl-2-thiourea;
1,3-diisopropyl-2-thiourea;
1,3-di(2-tolyl)-2-thiourea;
1,3-di(4-tolyl)-2-thiourea;
1(3-ethoxyphenyl)thiourea;
1-ethylthiourea;
1-ethyl-1-phenylthiourea;
1-ethyl-3-phenyl-2-thiourea;
1-ethyl-2-selenourea;
1-ethyl-2-tellurourea;
1-ethylidene-2-thiourea;
1-hydroxythiourea;
1(hydroxymethyl)thiourea;
1(2-iodo-3-methylbutanoyl)thiourea;
isobutylthiourea;
1(2-isopropyl-4-pentenoyl)thiourea;
1(4-methoxy-phenyl)thiourea;
1(2-methyl-2-butyl)thiourea;
1-methyl-3(1-naphthyl)-2-thiourea;
1-methyl-1-nitrosourea;
1-methyl-3-phenyl-2-thiourea;
S-methyl-2-thiourea;
S-methylisothiouronium iodide;
S-methylisothiouronium nitrate;
S-methylisothiouronium sulfate;
1-methyl-2-thiourea;
1(2-naphthyl)urea;
1(1-naphthyl)-3-phenyl-2-thiourea;
1(1-naphthyl)-2-thiourea;
1(2-naphthyl)-2-thiourea;
1-nitrothiourea;
1-oxalylthiourea;
1(2-phenoxy-ethyl)thiourea;
1-phenylthiourea;

1(phenyl-acetyl)thiourea;
1-phenyl-2-thiourea;
S-phenyl-2-thiourea;
2-selenourea;
2-tellurourea;
1(sulfonamylphenyl)thiourea;
1,1,3,3-tetramethyl-2-thiourea;
1,1,3,3-tetraphenyl-2-thiourea;
2-thio-1(2-tolyl)urea;
2-thio-1(3-tolyl)urea;
2-thio-1(4-tolyl)urea;
2-thio-1,1,3-trimethylurea;
2-thio-1,1,3-triphenylurea;
2-thio-1(3-tolyl)thiourea;
1,1,3-trimethylthiourea.

Some thiourea compounds in addition to thiourea that may be employed comprise:
phenylthiourea;
naphthylthiourea;
thiourea disulfide;
oligomers of thiourea and formaldehyde;
N-allylthiourea;
N-mono-p-tolylthiourea (and the equivalents thereof disclosed in U.S. Pat. No. 4,502,927, incorporated herein by reference);
N-alkylthioureas such as methylthiourea (and the equivalents thereof disclosed in West German Pat. No. 3,110,478)
monophenylthiourea;
metaphenylenedithiourea;
N,N'-ethylenethiourea;
N,N'-dibutyneylthiourea;
N,N'-dibutenylthiourea;
trifluoro acetylthiourea;
isothiourea-S-propionic acid;
amino substituted thioureas such as thiosemicarbazide and 1-phenylthiosemicarbazide; 1-aryl-thioureas where the aryl group is phenyl, benzylnaphthyl.

The surfactant (promoter) employed in the cleaner/conditioner composition, as noted above, comprises a conditioner selected from the group consisting of non-ionic, cationic, anionic and amphoteric surface active agents, especially those based on fatty acids. For the purpose of the present invention fatty acids comprise those substantially aliphatic acids having from about 10 to about 20 carbon atoms.

More particularly, the surfactants (promoter) employed in the cleaner/conditioner composition comprises:
  (a) quaternary ammonium compounds including;
    (i) cationic quaternary ammonium salts based on fatty amines,
    (ii) amphoteric quaternary ammonium salts based on fatty amines, and
  (b) nonionic surfactants of;
    (i) polyoxyethylene esters of fatty acids,
    (ii) polyoxyethylene esters of sorbitan fatty acid esters, and
    (iii) monoalkanolamides of fatty acids.

The cationic quaternary ammonium salts based on fatty amines that may be employed in this respect comprise:
(a) 1-propanaminium, N-(2-hydroxyethyl)-N-N-dimethyl-3-[(1-oxooctadecyl)amino]-, salts;
(b) 1-propanaminium, N,N,N-trimethyl-3-[(1-oxododecyl)amino]-alkyl ester salts;
(c) 1-propanaminium, (3-dodecyloxy)-2-hydroxy-N,N-bis(2-hydroxyethyl)-N-methyl-, alkyl ester salts.

The foregoing compounds may be prepared either as the phosphate salts, nitrate salts, methylsulfate salts and the like and are further identified as C.A. Reg. Nos. 3758-54-1; 2764-13-8; 1-595-49-0 and 18602-17-0. Although for purposes herein these compounds are defined as salts, this definition is intended to be broad enough to include the inorganic esters such as the lower alkyl esters, e.g., methyl sulfate as well as the organic salts, e.g. phosphates, nitrates, sulfates and the like.

Aliphatic amine ethoxylates of the formula:

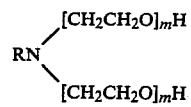

may also be employed as cationic quaternary ammonium salts based on fatty amines, as one of the groups of conditioners employed in the cleaner/conditioner composition of the present invention, wherein the aliphatic group R is derived from cocoa, soybean, tallow, stearyl or oleyl fatty acids. The value of m+n is anywhere from about 2 to about 15.

Additionally, alkylbenzyldimethylammoniumchlorides may be employed where the alkyl group is derived from a fatty acid and especially comprises a biphenyl group. Some specific surfactants (promoters) that may be used in lieu of the cationic surfactant include the nonionic surfactants such as the monoester of stearic acid and polyethylene glycol having a molecular weight of 400; the monoester of oleic acid and polyethylene glycol having a molecular weight of about 400; the diester of oleic acid and polyethylene glycol having a molecular weight of about 400; the diester of oleic acid and polyethylene glycol having a molecular weight of about 600; the monoester of lauric acid and polyethylene glycol having a molecular weight of about 400; the monoester of lauric acid and polyethylene glycol having a molecular weight of about 600; the monoester of stearic acid and polyethylene glycol having a molecular weight of about 1750; the polyoxyethylene derivative of sorbitan fatty acid monoesters where the fatty acid is either lauric acid, oleic acid or stearic acid and there are about 20 ethylene oxide groups in the esterified polyoxyethylene; oleic acid diethanolamide; oleic acid monoisopropanolamide ethyloxylated castor oil in which there are 200 ethylene oxide groups in the esterified polyoxyethylene.

Additionally, amphoteric surfactants based on fatty acids may also be used in lieu of the cationic quaternary ammonium salt such as the alkyl pyridinium halides or the amide propyl betaines, e.g., laurylpyridimium chloride or amidopropylbetaines of the formula:
RCONHCH$_2$CH$_2$CH$_2$N(+)(CH$_3$)$_2$CH$_2$(−)

where RCO can be either myristoyl or cocoyl.

The nonionic surfactant (promoter) of the cleaner/conditioner composition may comprise any surfactant that is compatible with the conditioner by which it is meant any surfactant that will not form a precipitate or adversely react with the conditioner as described herein. The surfactants generally defined as alkyl, e.g., octyl phenol poly(ethylene oxide) condensates have been found to be suitable in this regard. Nonyl phenol poly(ethylene oxide) condensates may also be employed in this respect such as Igepal CO 430 (trademark GAF). These compounds and their art-known homologs comprise the poly(oxyalkylene) condensates of alkyl phenols used according to the invention.

The foregoing and other surfactants, (promoters) falling within the above definitions as described in Kirk-Othmer, *Encyclopedia of Chemical Technology*, Third Edition, Vol 22, pp. 332–432 may be employed are incorporated herein by reference.

The acids that are employed according to the invention may be organic acids or inorganic acids (mineral acids) based on sulfur, phosphorous, nitrogen or the halogens, the sulfur based mineral acids being, e.g., sulfuric acid or sulfamic acid or methyl sulfonic acid. Solid acids may be used in this respect such as an alkali metal bisulfate, e.g., sodium bisulfate and the art known equivalents thereof. Fluoroboric acid may be used as one of the halogen acids in addition to acids based on hydrogen chloride, hydrogen fluoride, hydrogen bromide and hydrogen iodide. Some of the organic acids that may be employed according to the invention comprise monocarboxylic or dicarboxylic acids having up to about six carbon atoms such as formic acid, acetic acid, malaic acid, maleic acid, and the like.

The cleaner/conditioner bath is employed to clean the nonmetallic substrate such as the circuit board by any known method of application such as dipping, spraying, roller application or misting and is maintained at a temperature from about 10° to about 90° C. and especially from about 20° C. to about 80° C. The nonmetallic substrate is contacted with the cleaner/conditioner for a period of time sufficient for the cleaner/conditioner to function, this generally being from about 1 to about 20 minutes and especially from about 3 to about 5 minutes.

Any one of the foregoing promoters may be used in the cleaner/conditioner composition or any combination of promoters, i.e., any one of the chelating agents, thiourea compounds or surfactants may be employed alone as a cleaner/conditioner or various combinations thereof may be employed. By way of example, the Catanac (trademark) SP may be employed alone or the Triton X may be employed alone; however, when they are employed together, it is preferred that they be used with thiourea as well. The quantities of that they be used with the various components of the cleaner/conditioner may be adjusted experimentally to optimize them for any particular metal catalyst or metal coating composition bath that the cleaner/conditioner is subsequently used with and is well within the skill of the art. Additionally, thiourea, Triton X and a mixture of both an organic acid such as the citric acid and sulphuric acid may be employed alone as the cleaner/conditioner. Citric acid either in a water solution or a mineral acid solution has also been found to be effective in this respect.

The surface after treatment with the cleaner/conditioner is rinsed in distilled or deionized water after which it is treated with a catalyst for applying an electrolytic coating to the surface.

Although the cleaner/conditioner composition comprises a chelating agent, fluoride salt, thiourea compound or mixtures thereof, a conditioner, surfactant and acid, the cleaner/conditioner may be applied to the nonmetallic substrate in any sequence of steps such as by first applying the chelating agent and fluoride salt followed by the thiourea compound and conditioner or the chelating agent and the thiourea compound followed in sequence by an application of a mixture of the fluoride salt and surfactant agent and so forth. It is within the purview of the disclosure herein to employ the components of the cleaner/conditioner composition either individually or in any combination for a single or multiple step application of all of the components of the cleaner/conditioner composition or one or combinations of components of the cleaner/composition.

The surface that has been treated with the cleaner/conditioner and rinsed is then, treated with a catalyst for applying an electrolytic coating to the substrate.

The components of the catalyst are present in the following amounts on a molar basis:

|  |  |  |
|---|---|---|
|  | (a) | from about 0.1 to about 2 parts of a metal salt the metal of which can combine with hydrogen; |
|  | (b) | from about 3 to about 6 parts of an acid; |
|  | (c) | from about 4 to about 85 parts of a salt of $Sn^{2+}$; |
| (2-a) | (d) | from about 0.5 to about 10 parts of an alkali metal stannate or salt of $Sn^{4+}$; |
|  | (e) | from about 100 to about 1000 parts of a stabilizer. |

In one aspect a catalyst composition is provided comprising:

|  |  |  |
|---|---|---|
| SOLUTION I | palladium chloride | 0.19–3.8 g/l |
|  | HCl (11.7%) | 0.25–5 ml/l |
|  | sodium stannate ($Na_2SnO_3.3H_2O$) | 1.4–28 g/l |
|  | stannous chloride | 8.2–164 g/l |
| SOLUTION II | $AlCl_3.6H_2O/H_2O$ | 50–1000 g/l |
|  | SOLUTION I | 25–500 ml |
| (2-b) | SOLUTION II | 75–1500 ml |

A catalyst composition may be prepared comprising the following:

|  |  |  |
|---|---|---|
| SOLUTION I | palladium chloride | 1.9 g/l |
|  | HCl (11.7%) | 2.5 ml/l |
|  | stannous chloride | 82 g/l |
|  | sodium stannate ($Na_2SnO_3.3H_2O$) | 14 g/l |
|  | water | balance |
| SOLUTION II | $AlCl_3.6H_2O$ | 500 g/L |
|  | SOLUTION I | 250 ml |
| (2-c) | SOLUTION II | 750 ml |

Aluminum chloride is used as a stabilizer in formulas (2-b) and 2-c).

The catalyst composition, according to one embodiment may be prepared as follows:

SOLUTION I

Dissolve 1.9 g of $PdCl_2$ in 25 ml aqueous 11.7% HCl and mix for 15–25 minutes. The hydrochloric acid acts as a solvent for the palladium chloride although other solvents may be used such as water or an organic solvent. The solution of palladium chloride then has 75 ml of an aluminum chloride solution comprising 500 g per liter of $AlCl_3.6H_2O$ added to it followed by mixing for 30 minutes to complete the dissolution of the palladium chloride. Stannous chloride (3.7 g) is then added to the solution followed by mixing for 10 minutes.

SOLUTION II

Stannous chloride (78 g) is added to 500 ml of an aluminum chloride solution as prepared for SOLUTION I followed by mixing for 20–30 minutes. A turbid solution is obtained. A sodium stannate solution is prepared separately by mixing 14 grams $Na_2SnO_3.3H_2O$ in 100 ml of the aluminum chloride solution as prepared in SOLUTION I. This mixture of sodium stannate in the aluminum chloride solution is then added to the stannous chloride-aluminum chloride solution slowly and the two are then mixed for 10 minutes. A solution is then obtained with some precipitate in it.

SOLUTION II (including the precipitate) is then added to SOLUTION I within 1 minute after which the combination of SOLUTION I and SOLUTION II are heated from about 60° to about 70° C. for 3 hours with constant agitation. This mixture is then let stand and colled to room temperature while the stirring is continued and a highly concentrated catalyst is obtained. The concentrated catalyst is used in practice by combining 1 ml of the concentrated catalyst with 3 ml of the aluminum chloride solution as prepared for SOLUTION I.

The foregoing preparation of the catalyst may be speeded up by modifying the preparation of SOLUTION I so that the palladium chloride dissolved in hydrochloric acid is mixed with the aluminum chloride solution for a period of 5 minutes after being heated to 90° C. after which the 3.7 g of the stannous chloride is added to the mixture obtained. SOLUTION II is then added immediately within a period of 1 minute, then heated for 15 minutes to 90°-100° C.

In the foregoing catalyst composition the metal catalyst than can combine with hydrogen preferably is based on the Group VIII metals of the Periodic Table of the Elements and especially the Group VIII noble metals of the Periodic Table of the Elements, e.g., rhodium, palladium, osmium, iridium and platinum. Palladium is especially preferred in this respect. It has been found that the metal catalyst can be prepared from halogen salts of the catalyst and that halogen acids may be employed in the catalyst composition of the present invention. Palladium chloride has been found to be especially suitable as the metal salt from which the metal catalyst is prepared. The foregoing metal catalysts may also be employed in amounts as low as 10 ppm and as high as 20 g/l.

The various acids employed in the catalyst composition again comprise the art known mineral acids and organic acids such as those mineral acids and organic acids set forth herein and especially hydrochloric acid. The hydrochloric acid is generally employed in an amount sufficient to dissolve the palladium chloride.

The salt of $Sn^{2+}$ is again based on the art known mineral acids and organic acids and especially comprises stannous chloride whereas the alkali metal stannate or the salt of $Sn^{4+}$ is selected to equilibrate in the catalyst with the salt of $Sn^{2+}$. The alkali metal stannates are based on the Group IA metals of the Periodic Table of the Elements or the Group IIA metals of the Periodic Table of the Elements such as lithium, sodium, potassium, calcium, strontium or barium, ammonium cations, for the purposes of the present invention, being considered a cation that falls into this category and which may be employed. It has been found that by employing the alkali metal stannate or a salt of $Sn^{4+}$ that better coverage is obtained of the catalyst on the non-metallic substrate providing a more efficient coverage rate and less chance of voids.

The stabilizer metal salt in one embodiment is a metal salt that can be hydrolyzed to yield a metal hydroxide precipitate having a pK lower than $SnOHAn_1$ and preferably is one where $An_1$ is a monovalent anion based on the art known mineral acids and organic acids, especially those described herein and preferably a halide such as a chloride ion.

The stabilizers that may be employed in this respect comprise the Group IIIA metal salts of the Periodic Table of the Elements and especially the water soluble, stable halide salts and more particularly, the chlorides or bromides. Those Group IIIA salts that exist in the "dimer" form such as aluminum chlorohydrate have found to be especially useful. Other Group IIIA salts that may be employed in this respect, especially the dimer salts are described more fully by Cotton and Wilkinson *Advanced Inorganic Chemistry* 1972 pp. 264–265 which is incorporated herein by reference. The stable, water soluble salts and especially the halide salts of the Group IIIA metals are those that are preferred such as aluminum chloride.

Other stabilizers that may be employed in this respect comprise other Group IIIA metal salts or metal salts that will form complexes with the Group VIII metals especially the Group VIII noble metals and/or tin Examples of such salts and complexes comprise by way of example, aluminum bromide; aluminum bromide hexahydrate; aluminum bromide pentadecylhydrate; aluminum chloride, aluminum chloride hexahydrate; aluminum iodide; aluminum iodide hexahydrate; cadmium chloride; cadmium chloroplatinate; cobalt II bromide; cobalt bromoplatinate; cobalt II chloride dihydrate; cobalt II chloride hexahydrate; cobalt chloride; cobalt chloroplatinate; cobalt II iodate; cobalt II iodate hexahydrate; cobalt II alpha iodide; cobalt chlorostannate; cobalt II iodide dihydrate; cobalt II iodide hexahydrate; cobalt iodoplatinate; cobalt II orthostannate; magnesium bromide; magnesium bromide hexahydrate; magnesium bromoplatinate; magnesium chloride; magnesium chloride hexahydrate; magnesium chloropalladate; magnesium chloroplatinate; magnesium chloro stannate; magnesium cyanide; magnesium cyanoplatinide; magnesium platinocyanide; manganese diiodide; manganese iodide tetrahydrate; manganese hexaiodoplatinate; nickel chloride; nickel chloride hexahydrate; nickel chloropalladate; nickel chloroplatinate; silver nitrite; silver nitriplatinate; thallium chloride; thallium tri- chloride; thallium trichloride monohydrate; thallium tri-chloride tetrahydrate; thallium chloroplatinate; zinc chloride; zinc chloroplatinate; and the like.

Other stabilizers that may be employed comprise titanium tetrachloride, and titanium oxychloride as well as zirconium oxychloride; zirconium chloride, hafnium oxychloride; hafnium chloride; gallium oxychloride and gallium chloride.

A Group VIII metal catalyst that may be employed may comprise the conventional palladium catalyst ordinarily utilized for the electroless copper steps described herein for the manufacture of printed circuit boards, the palladium catalyst in this respect comprising either the two component (stannous chloride sensitizer solution followed by a super sensitizer solution of divalent palladium chloride) or the colloidal palladium catalyst containing stannic tin as a protective colloid around the palladium catalyst. These conventional catalysts may be employed alone or in combination with the promoters and/or stabilizers as noted herein.

An optional "brightener" may also be employed in the catalyst composition in an amount from about 10 ppm up to about 10 g/l such as those brighteners disclosed in the U.S. Pat. Nos. 4,490,220, to Houman; 4,347,108, to Willis; 4,278,739, to Coll-Pallagous;

4,272,335, to Combs; 3,798,138, to Ostrow et al.; 3,770,598, to Creutz, and 3,725,220, to Kessler et al.

In applying the catalyst composition, the cleaned and conditioned substrate as obtained from the previously described process for employing the cleaner/conditioner is immersed in the catalyst for a period of time from about 0.5 to about 15 minutes and especially from about 3 to about 5 minutes, the catalyst being maintained at a temperature of from about 15° to about 80° C. and especially from about 60° to about 65° C. After the substrate is immersed in the catalyst composition, it is rinsed in distilled or deionized water and is thereby ready to be electroplated.

The catalyzed surface coated electrolytically in a metal plating composition or bath known in the art.

The components of the metal plating bath may be present in the following amounts on a molar basis:

| (3-a) | (a) from about 2.5 to about 50 parts of a metal salt |
| | (b) from about 15 to about 40 parts of an acid |
| | (c) from about 0.4 to about 8 parts of an adjuvant (promoter), e.g., hydroxy compound |
| | (d) from about 50 to about 100 ppm of a halide ion. |

The metal composition of bath may be a copper plating bath in one embodiment and comprises the following composition of matter:

| (3-b) | $CuSO_4.5H_2O$ | 30–300 g/l |
| | $H_2SO_4$ (98%) | 10–200 ml/l |
| | pyrogallol (1) | 0.05 lg/l |
| | chloride ion | 10.0–100 ppm |
| | water | balance |

The copper plating bath may be:

| (3-c) | $CuSO_4.5H_2O$ | 80 g/l |
| | $H_2SO_4$ (98%) | 100 ml/l |
| | pyrogallol (1) | 0.5 g/l |
| | chloride ion as NaCl or HCL | 50–100 ppm |
| | water | balance |

Metals besides copper may be plated and are known in the art. Examples of such metals are Au, Ag, Co, Ni, Pb, Pd, Pt and the like.

The anion of the metal salt in the plating composition or bath may be based on any of the acids described herein and the acids employed in the plating bath may similarly be selected from the acids described herein. Mineral acids are especially suitable in both respects.

The adjuvant (promoter) may comprise a polyhydroxy compound including a cyclic polyhydroxy compound having a six carbon atom ring and from 2 to about 3 hydroxy groups on the ring and is optionally mixed with a cyclic hydroxy compound having a six carbon atom ring and one hydroxy group on said ring, the cyclic hydroxy compound being present in an amount from 0 to about 80 molar percent of said polyhydroxy compound on a molar basis.

The polyhydroxy cyclic compound may also comprise a saturated, partially unsaturated or unsaturated ring having from 5 to about 14 carbon atoms and may be either a monocyclic or bicyclic compound which optionally contains substituents in addition to the hydroxy groups. The polyhydroxy cyclic compound, may also comprise a heterocyclic cyclic compound containing ring nitrogen, sulfur or oxygen atoms or combinations thereof and also may be saturated, partially unsaturated or unsaturated; substituted with other than hydroxy groups and may contain from 5 to about 14 ring carbon atoms and also may be either a monocyclic or bicyclic compound.

The polyhydroxy cyclic compounds that may be employed in this respect generally have the formula:

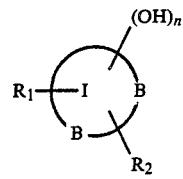

where

"I" is either a five member or a six member ring which is saturated, partially unsaturated or unsaturated;

B=C,N,S,O or various combinations thereof so that "I" may be benzene, cyclohexane, cyclopentane, cyclopentene, thiophene, furan, pyran, isothiazole, pyrrole, imidazole, pyrazole, pyridine, pyrazine, pyrimidine, pyridazine pyrrolidine, pyrroline, isoxazole, isothiazole, furazan, imidazoline, pyrazolidine, pyrazoline, piperidine, piperazine, indoline, isoindoline, morpholine and the like.

$n = 2$ to about 3

$R_1$ = hydrogen, lower alkyl such as an alkyl group having from 1 to about 6 carbon atoms whether straight chain or branched chain, $NH_2$, $CONH_2$, COOH, $SO_3H$, S—S—H; $R_2 = R_1$ or hydrogen or when taken with "I" forms naphthalene, anthracene, phenanthrene, quinoline, isoquinoline, phthalizine, naphthyridine, quinoxaline, quinazoline, cinnoline, pteridine, phenylbenzene, toluene, benzofuran and the like or a indolizine, isoindole, indole, indazole, purine, carbazole and the like.

The varous compounds that may be used as a polyhydroxycyclic compound include, resorcinol, pyrogallol, and phloroglucinol.

Polyhydroxy cyclic compounds having from 1 to about 2 nitrogen atoms are especially effective such as 2,4-dihydroxy-6-methylpyrimidine.

The various acetylenic alcohols (promoters) that may be employed in the copper plating bath comprise propargyl alcohol; butyne diol; hydroxyethyl propargyl ether; bis(hydroxyethoxy)butyne; 2-hydroxypropylbutynyl ether; hexyne diol; 2-methyl-3-butyne-2-ol; 3-methyl-1-penten-3-ol; 3,4-dimethyl-1-pentyn-3-ol; 3-ethyl-1-pentyn-3-ol; 3-isopropyl-4-methyl-1-pentyn-3-ol; 3-methyl-1-hexyne-3-ol; 3-propyl-1-hexyne-3-ol; propargylsulphonic acid; 1-butyne-3-sulphonic acid. Acetylenic compounds (promoters) may comprise 1-pentyne-5-sulphonic acid; 4-diethylamino-2-butyne-1-ol; (N-methyl)propargyl-amine; 1-di(N)ethyl amino-2-propyne; 4-diethylamino-1-butyne-1,6-bis(morpholino)-2-hexyne; 2-butyne-1,4-disulphonic acid; 1-or 2-butyne sulphonic acid; propargylsulphonic acid; 1-pentyne sulphonic acid, the various ammonium salts of the aforementioned acids; N-propargyl saccharin; 2-butyne disulphonylether and the like and mixtures thereof.

The halide ion employed in the metal plating composition or bath may be a fluoride, chloride, bromide or iodide ion or mixtures thereof. Chloride ions have been found to be effective in this respect. The cation employed in combination with the halide ion generally comprises any cation or mixtures thereof based on Group IA metals or Group IIA metals of the Periodic Table of the Elements such as lithium, sodium, potassium, magnesium, calcium, strontium, and barium, ammonium cations also being suitable in this regard.

Water soluble polymers may also be employed as an adjuvant (promoter) in the metal plating composition or bath. The water soluble polymers that may be employed in this respect comprise synthetic or natural polymers that are generally solid or near solid at room temperature (about 20° C.) are soluble in water under the conditions the composition is used and are stable in an acid environment, i.e., a pH of about 1 to about 6.8. Stability in this regard is the resistance of the polymer to decompose and/or discolor under the conditions of use. Conditions of use include both the use in the composition and when the composition is applied to form a coating on a surface. An acrylic resin. Acrysol WS-24, (trademark), sold by Rohm and Haas is especially suitable in this respect and comprises a polymer of acrylic acid. Other water soluble acrylic polymers may be employed including the copolymers of acrylic acid and methacrylic acid and the mono lower alkyl esters thereof, e.g., methacrylic acid - butyl acrylate copolymers. Polymers of methacrylic acid and partial lower alkyl esters thereof or of acrylic acid may also be employed. The acrylic polymers that are employed typically have molecular weights from about 2000 to about $4 \times 10^6$ and are commercial products well known in the art. All of the foregoing acrylic resins will be referred to herein as acrylic polymers.

Other water soluble polymers that may be employed in this regard comprise the poly(vinyl alcohols) or copolymers of poly(vinyl alcohol) and vinyl acetate; polyacrylamides, including both the nonionic, cationic and anionic types, the nonionic and cationic being especially preferred, some of which are sold under the trademark of 37 Separan38 0 (Dow Chemical Co.), e.g., Separan NP10, AP273, MGL, MG200, MG500, PEG, CP-7 and 87D; polyethylene oxide resins having a molecular weight of from about $10 \times 10^5$ to about $5 \times 10^6$ provided that the cloud point of the polymer in water does not adversely affect the coating properties of the composition which will vary with the components of the composition; poly(N-vinyl-2-pyrrolidinone) homopolymers and copolymers with vinyl acetate having a molecular weight from about 2500 to about $6.3 \times 10^5$ and sold under the trademark "Kollidon" (homopolymer) and "Luviskol"(copolymer) by BASF, the homopolymer being preferred because of its increased water solubility; vinyl ether polymers such as the homopolymers of alkylvinyl ethers, vinyl ether-maleic anhydride copolymers, especially methylvinyl ether-maleic anhydride copolymers sold under the trademark "Gantrez"by GAF; styrene-maleic anhydride copolymers having a molecular weight of from about 1000 to about 50,000; ethylene maleic anhydride copolymers having a molecular weight of from about $8 \times 10^3$ to about $1 \times 10^5$; phenol formaldehyde resins such as resols (base catalyzed one-step) water soluble resins and their precursors such as dimethylol phenol and the like; amino resins and plastics such as condensation products of formaldehyde with urea, melamine, benzoguanamine, acetoguanamine, aniline, toluenesulfonamide, acrylamide and the like, the methylol condensation products of these amines being especially suitable because of their solubility in water; specific amine resins include urea formaldehyde, melamineformaldehyde, methylolurea, dimethylolurea, mono-, di-, and trimethylolmelamine, alkylated urea formaldehyde resins including alkylated methylol and dimethylolurea (where the alkyl group is a lower alkyl, i.e., from 1 to about 4 carbons), alkylated melamine formaldehyde resins as well as alkylated mono-, di- and trimethylol melamines where the alkyl group is the same as defined for the alkylated urea formaldehyde resins; ethyleneurea resins; propyleneurea resins; triazone resins; uron resins, i.e., mixtures of melamine resins, N,N'-bis(methoxymethyl)uron and methylated urea formaldehyde resin; glyoxal resins commonly referred to as resins of dimethyloldihydroxyethyleneurea; methylol carbamates; methylol derivatives of acrylamine, hydantoin and dicyandiamide; natural polymers such as the vegetable gums including agar, carragenan, corn starch, guar gum, gum arabic, gum karaya, gum tragacanth, locust bean gum; starches derived form potatoes, wheat and rice; tapioca; hydroxyalkyl starch; hydroxy methyl or ethyl cellulose; hydroxy propyl cellulose; methyl cellulose; ethyl cellulose; sodium carboxymethyl cellulose; xanthan gum; pectin; casein (milk protein); animal gelatine and the like. All of the foregoing are standard items of commerce and are readily available. Hydroxy ethylcellulose is preferred especially in combination with glucose. Mixtures of these water soluble polymers may also be used.

When the water soluble polymer is employed in the metal plating bath formulas it will be added in an amount such that when the components of these formulas are made up into a solution, the final concentration of the water soluble polymer in the solution used will be about 0.01 g/l up until a concentration such that a workable viscosity is not exceeded in the plating bath composition. Hydroxyethyl cellulose and hydroxy methylcellulose have been shown to the effective in this respect in some of the electroplating bath compositions of the present of the Catanac or Triton X surfactants or combinations thereof.

The catalyzed surface obtained from the previous steps of the process is then immersed in the metal plating bath and employed as a cathode in a standard manner. The bath is maintained at from about 18° to about 30° C. and a current is applied to the board at a current density of from about 0.1 to about 10 and especially from about 2 to about 6 amps/square decimeter for a period of time sufficient to get an electrolytic buildup of metal on the board.

Although the potential employed for the copper plating bath may be anywhere from about 0.4 to about 1.2 volts the potential that is employed for the process of the invention depends on the cell configuration, the concentration of the plating bath solution, the cathode and anode size, shape, and spacing as well as the agitation employed in the bath, whether mechanical or air agitation, the size and shape of the substrate and where the substrate comprises the through holes of a circuit board (whether a double sided single board or a multilayer board) the size of the hole, the promoters employed and the metal that is being plated. In the latter respect, it should be noted that although about 0.4 to about 1.2 volt potential employed for plating copper will effect through hole plating in most conventional copper plating baths, a potential of about 3.0 volts is required to obtain similar results with a gold plating bath. Further in this regard, when the process is employed to provide coatings on the surface of a printed circuit board, different potentials will also be required, all of which can be determined by a person having ordinary skill in the art. The current and current density is therefore adjusted along with the potential so as to obtain a substantially void free continuous metal layer.

In the above description the process is for depositing a metal on a nonconductive surface by employing the reductive capacity of hydrogen in the presence of a metal catalyst on the surface, the metal catalyst being capable of combining with hydrogen that is generated electrolytically from a protic bath; the surface being contacted with said metal catalyst to obtain a surface that is combined with said catalyst; the surface combined with said metal catalyst being contacted with a protic bath; the steps comprising:

(a) electrolytically generating hydrogen from the protic bath in an amount sufficient to combine with the metal catalyst and thereby obtain a metal catalyst combined with hydrogen on the surface (b) contacting the metal catalyst combined with hydrogen on the surface with a metal salt for a time sufficient to reduce said metal salt to a metal coating on the substrate.

A further process for electroplating of a nonmetallic surface employing a catalyst is disclosed in British Pat. No. 2,123,036 with named inventors of Dennis Morrissey, Takoch and Rudolph Zeblisky. In accordance with teachings of this publication the following passages are extracted therefrom.

A method is disclosed for metallizing nonmetallic surfaces by electroplating in a vessel provided with a counter-electrode and containing an electroplating bath solution comprising in ionic form a metal (B) to be electroplated, said surfaces being provided with metallic sites and a connector area, said connector area being located outside of the nonmetallic surface area to be electroplated, characterized by the steps comprising (a) forming a plurality of metallic sites on said surfaces, said sites comprising or consisting of a metal (A), said metal (A) being different from said metal (B) to be deposited on said surface by electroplating; providing said surface with a connector area said connector area (connector electrode) being located outside of the nonmetallic surface area to be electroplated; exposing said surface including at least a portion of said connector area to an electroplating bath solution having a defined conductivity and comprising said metal (B) to be electroplated in ionic form; and one or more components (C) which cause preferential deposition of said metal (B) on said metallic sites comprising or consisting of metal (A), compared to the deposition on surfaces consisting of, or formed by the species of the electrodeposited metal (B); providing the vessel containing the said electroplating bath solution with a counterelectrode; applying a potential to the connector area and the counter-electrode sufficient to initiate and cause the preferential deposition of metal (B) on said sites comprising or consisting of metal (A), for a time sufficient to form a deposit of substantially uniform desired thickness.

In one embodiment, the rate of deposition on the metallic sites is at least one order of magnitude greater and preferably two orders greater than the rate of deposition on the plated-out metal.

In another embodiment, the metallic sites and the metal to be deposited are comprised of metals selected from Groups IB or VIII of the Periodic Table of Elements provided that they are not the same.

In still another embodiment, the component referred to above is selected from dyes, surfactants, chelating agents, brighteners or leveling agents.

In yet another embodiment, the substrate provided with metallic sites is exposed to one or more of the following treatments: heat treatment; treatment with a cleaner conditioner; and/or treatment with a reducing agent.

This publication discloses that a special advantage obtained in the manufacture of plated-through hole printed circuits is the integrity of the copper hole wall. Since the copper is electroplated directly on the nonmetallic hole wall substrate without an intervening electrolessly formed metal layer, the physical properties and adhesion at the copper-plastic interface as well as the adhesion between foil copper and the electroplated metal, e.g., copper-deposit, are greatly improved. This is particularly important in the manufacture of high reliability printed circuits such as multilayers.

In practice, the method for electroplating nonmetallic surfaces on a substrate involves the steps of forcing discrete metallic sites on the surface to be plated in which said metallic sites are of a metal species different from the species of the metal to be electroplated, providing a connector area on said substrate and outside the nonmetallic surface area to be electroplated, contacting said surface to be plated and at least part of the connector area with an electroplating bath solution which contains a plateable metal of the species to be electrodeposited and a component which allows preferential deposition of said metal to be deposited on said metallic sites over plated-out metal from said electrodepositing metal, providing a vessel containing the electroplating bath solution with a counter-electrode, and applying a potential between the electrodes formed by said connector area and said counter-electrode sufficient to initiate and cause preferential deposition on the surface provided with said sites for a time sufficient to form a deposit of desired, substantially uniform thickness.

Preferred metals for (A) are selected from palladium, platinum, silver and gold with the most preferred being palladium.

Preferred metals (B) are selected from copper and nickel. The preferred electroplating bath solutions are acidic. Component (C) may be selected from dyes, surfactants, chelating agents, brighteners and leveling agents which preferentially attach themselves to surfaces comprising or consisting of metal (B) and acting by reducing or inhibiting the plating reaction and/or form depolarizing agents preferentially attaching themselves to surfaces consisting of metal (A) and increasing the plating reaction on said surface.

Suitable dyes are, e.g., the ones selected from Victoria Pure Blue F80, methylene blue, methyl violet, acid blue 161, alcian blue 8GK, and other N-heterocyclic compounds, triphenylmethane type dyes and aromatic amines, imines, and diazo compounds including fused ring amines, imines, and diazo compounds. Suitable surfactants include nonionic surfactants such as alkylphenoxy polyethoxyethanols, e.g., octylphenoxy polyethoxyethanol, and nonionic fluorocarbon surfactants such as Zonyl FSN ®.

Among the many surfactants including wetting agents and water soluble organic compounds proposed for use in electroplating solutions, are surfactants and polymers containing polyoxyethylene. Compounds containing as low as four and as high as one million oxyethylene groups have been found to be effective. A preferred group of said compounds includes polyoxyethylene polymers having as few as twenty and as many as one hundred fifty oxyethylene groups. Also preferred are block copolymers of polyoxyethylene and polyoxypropylene. Among these preferred block copolymers are those containing from seven to two hundred fifty oxyethylene groups. In general, it has been found that these polyoxyethylene compounds when added to an electroplating bath solution, particularly an acidic electroplating bath solution, will greatly enhance the growth of electroplated metal (B) on the nonconductor surfaces provided with said metallic sites (A). Most frequently, these polyoxyethylene compounds are used in the electroplating bath solutions in a concentration range of 0.1 to 1.0 g/l. The optimum concentration depends on the composition of the electroplating bath solution and the polyoxyethylene compound selected. In some cases less than 0.1 g/l or more than 1.0 g/l may be preferred.

Representative chelating agents include riboflavin, 2,4,6-(2-pyridyl)-s-triazine and the pyrophosphate anion. Suitable brighteners and leveling agents include N-heterocyclic compounds, triphenylmethane type dyes, thiourea and thiourea derivates. Among the thiourea derivates which are suitable for use are tetramethylthiuram disulfate and allyl thiourea. Suitable commercial examples are Electro-Brite PC-667[hu RTM [l and Copper Gleam PC ®. Other suitable additives include saccharin, and o-benzaldehyde sulfonic derivates which are especially useful in Watts nickel plating bath solutions.

In the preferred embodiment metallic sites are forced by treating the respective surface with a solution comprising the metal (A) as a compound or complex, e.g., as metal-halide as exemplified by palladium-tin chloride, a double metal halide.

In forming metallic sites of metal (A) it has been found advantageous, following the treatment with the said solution, to expose the surface to a reducing agent.

In the case of the site-forming compound comprising tin, it has further been found advantageous to remove the tin-compound from the surface provided with sites. This is accomplished by a tin removing solvent such as a dilute aqueous fluoroboric acid solution or strongly basic solutions which allow formation of soluble alkali stannates.

In order to achieve improved shelf-life of the surfaces provided with sites it has been found advantageous to expose the surface treated with the site-providing solution to a heat treatment, e.g., at a temperature of 65° to 120° C. for 10 minutes or longer. It has been found that surfaces thus treated immediately after removal from the site-providing solution may be stored for extended periods of, e.g., 9 months without detrimental influence. It is advantageous after extended storage to expose the surface provided with sites to an acidic solution, e.g., one molar sulfuric acid, for 15 to 20 minutes.

Suitable reducing agents mentioned above may be selected from sodium borohydride, formaldehyde, dimethylamine borane or hydroxylamine. It has also been found advantageous to pretreat the nonmetallic surface prior to the site-providing step by exposing it to a cleaner conditioner, for example, an aqueous solution containing a blend of nonionic and cationic wetting agents. Such cleaner conditioners are widely used in printed circuit and plating on plastics arts.

In the following examples parts and percentages are by weight and temperatures in degrees centrigrade unless otherwise indicated.

EXAMPLE 1

A 62 mil thick epoxy/glass board laminated on both sides with 1 oz. copper foil was drilled with a total of 200 holes, deburred, and cut to size (6"×6"). The holes were drilled on 100 mil centers in four sets of fifty with the sets being 15, 20, 30, and 40 mil in size, respectively. These steps constituted the conventional, art-known method of preparing boards for PCB manufacture.

The board was mechanically scrubbed and laminated with one of the following Riston ® dry-film photoresist 3215, 3615, or 1715, imaged and developed using standard processing techniques for patterning PCBs. Resist 1715 was developed in 1,1,1-trichloroethane while 3215 and 3615 were developed in 1% $Na_2CO_3$. The imaging step exposed to actinic radiation the entire surface of the resist except for the through holes and surrounding pad areas and trace circuit patterns. During developing the openings to the through holes pad areas and circuit traces were uncovered. The board was racked and immersed in a cleaner/conditioner at 62° C. for 5 minutes with mechanical board movement. This movement was a 1½ stroke provided by an 18 rpm motor. The composition of the cleaner/conditioner, was:

| | |
|---|---|
| Thiourea | 23 g/l |
| Triton X-100 | 0.90 ml/l |
| Sulfuric acid | 100 ml/l |
| Citric acid | 50 g/l |
| Tartaric acid | 47 g/l |
| Ammonium bifluoride | 2 g/l |
| Water | balance |

The board was immersed in a catalyst at 62° C. for 5 minutes with the same mechanical board movement as previously employed. The catalyst was prepared by the following procedure for SOLUTION I and SOLUTION II.

SOLUTION I

Dissolve 1.9 g of $PdCl_2$ in 25 ml aqueous 11.7% HCl and mix for 15-25 minutes. The hydrochloric acid acts as a solvent for the palladium chloride. The solution of palladium chloride then has 75 ml of an aluminum chloride solution comprising 500 g per liter of $AlCl_3.6H_2O$ added to it followed by mixing for 30 minutes to complete the dissolution of the palladium chloride. Stannous chloride (3.7 g) is then added to the solution followed by mixing for 10 minutes.

SOLUTION II

Stannous chloride (78 g) is added to 500 ml of an aluminum chloride solution as prepared for SOLUTION I followed by mixing for 20-30 minutes. A turbid solution is obtained. A sodium stannate solution is prepared separately by mixing 14 grams $Na_2SnO_3.3H_2O$ in 100 ml of the aluminum chloride solution as prepared in SOLUTION I. This mixture of sodium stannate in the aluminum chloride solution is then added to the stannous chloride-aluminum chloride solution slowly and the two are then mixed for 10 minutes. A solution is then obtained with some precipitate in it.

SOLUTION II (including the precipitate) is then added to SOLUTION I within 1 minute after which the combination of SOLUTION I and SOLUTION II are heated from about 60° to about 70° C. for 3 hours with constant agitation. This mixture is then let stand and cooled to room temperature while the stirring is continued and a highly concentrated catalyst is obtained. The concentrated catalyst is used by combining 1 ml of the concentrated catalyst with 3 ml of the aluminum chloride solution as prepared for SOLUTION I.

After application of the catalyst individual boards were wiped with aqueous solutions of 0.4% NaOH, 4% NaOH, 2% Na$_2$CO$_3$, 10% Na$_2$CO$_3$ as well as solvents of methylene chloride, 1,1,1-trichloroethane and acetone. As a control in one case no chemical was applied to the catalyst.

The following results were obtained.

| Chemical Used (30-second sponge wipe) | Selective Removal of Catalyst from Photoresist as Determined by Copper Coverage | | | % Hole Coverage |
|---|---|---|---|---|
| | % Resist Coverage | | | |
| | 1715 | 3215 | 3615 | |
| None | 100 | 100 | 100 | 100 |
| 0.4% NaOH | 50 | 0 | <10 | 100 |
| 4% NaOH | 40 | 0* | 0* | 100 |
| 2% Na$_2$CO$_3$ | 100 | 100 | 100 | 100 |
| 10% Na$_2$CO$_3$ | 50 | <5 | <5 | 100 |
| Methylene Chloride | Destroyed resist | | | 100 |
| 1,1,1-Trichloroethane | <10 | 100 | 100 | 100 |
| Acetone | <10 | Destroyed resist | | 100 |

*Fine photoresist lines partially destroyed.

The key result is the percent copper coverage of the photoresist versus the percent copper coverage of the hole wall. The objective of the process was to have no copper deposited on the photoresist while obtaining complete hole wall copper coverage. Table 1 shows, for three types of photoresist film, the results using various chemicals.

Encouraging results were observed with NaOH solutions as the wipe chemistry, especially on the aqueous 3215 and 3615 photoresist films. However, as the concentration of NaOH becomes too high, the finer photoresist lines are partially destroyed; the best results were obtained with 0.4% NaOH. A wipe chemistry of 10% Na$_2$CO$_3$ also gives good results on the 3215 and 3615 films. For the solvent 1715 films, a 1,1,1-trichloroethane wipe or an acetone wipe provided the best results.

The board was electroplated in a bright acid copper with the following formulation:

| | | |
|---|---|---|
| Copper sulfate pentahydrate | 80 | g/l |
| Sulfuric acid | 120 | m/l |
| Chloride ion (as HCl) | 75 | ppm |
| 2,4-dihydroxy-6-methyl-pyrimidine | 0.25 | g/l |
| Hydroxyethylcellulose (Natrosol ® 250LR) | 0.44 | g/l |
| Water | balance | |

Plating was for 10 minutes at 0.8 volts. The board was moved mechanically in the air-agitated electroplating "C" bath at 25° C.

In all cases the thickness of copper plated in the holes was approximately 0.2 ml measured by cross-sectioning and microscopic inspection at 50X. Thicker copper deposits were obtained by plating for a longer time.

Note: Between operations rinsing took place where appropriate. All rinses were triple-stage deionized water rinses with the boards moved manually back and forth for 20 seconds in each stage. This ensured thorough rinsing of all holes.

Subsequent to copper electroplating, the board is tin-lead plated, the resist is stripped and the board is copper etched in a manner well-known in the prior art.

What is claimed is:

1. A process of electroplating an adherent electrically conductive coating onto a catalyzed nonconductive surface wherein the improvement comprises plating the conductive coating on at least one catalyzed through hole wall in a conductive layer and an insulating layer to form an electrically conductive pathway through the hole and plating the conductive coating in a pattern on a surface of the conductive layer comprising the steps of:
   (a) forming at least one through hole through two layers of an article comprising a conductive layer and an insulating layer;
   (b) forming a resist image on the surface of the conductive layer;
   (c) applying all essential components of a catalyst system to the resist, exposed surface of the conductive layer and through hole wall;
   (d) applying a removing or deactivating substance to the surface of the resist which does not substantially penetrate into the through hole and which removes or deactivates catalyst on the surface of the resist without substantially affecting the catalyst present on the surface of the through hole;
   (e) electroplating the through hole with an adherent conductive layer to form an electrically conductive pathway without plating an adherent conductive layer on the resist.

2. The process of claim 1 wherein a cleaner-conditioner is a portion of the catalyst system.

3. The process of claim 1 wherein the adherent conductive coating is copper.

4. The process of claim 1 wherein at least one hundred holes are present and are electroplated simultaneously.

5. The process of claim 1 wherein the resist is removed after the step of electroplating.

6. The process of claim 1 wherein a photosensitive precursor is employed which is imagewise exposed to actinic radiation to form the resist with unexposed photosensitive precursor removed to allow the through hole to be electroplated.

7. The process of claim 1 wherein the through hole is formed in at least two conductive layers separated by the insulating layer.

* * * * *